United States Patent [19]

Okuda et al.

[11] Patent Number: 5,180,433
[45] Date of Patent: Jan. 19, 1993

[54] EVAPORATION APPARATUS

[75] Inventors: Akira Okuda, Sakai; Yoshikazu Yoshida, Izumi, both of Japan

[73] Assignee: Matsushita Electric Industrial Co., Ltd., Osaka, Japan

[21] Appl. No.: 846,687

[22] Filed: Mar. 4, 1992

[30] Foreign Application Priority Data

Mar. 5, 1991 [JP] Japan .................................. 3-38331

[51] Int. Cl.⁵ .............................................. C23C 14/24
[52] U.S. Cl. ..................................... 118/718; 118/715; 118/723; 118/724
[58] Field of Search ................. 118/715, 718, 723, 724

[56] References Cited

FOREIGN PATENT DOCUMENTS

| | | | |
|---|---|---|---|
| 3302900 | 8/1983 | Fed. Rep. of Germany ...... | 118/718 |
| 62-185877 | 8/1987 | Japan .................................. | 118/718 |
| 62-247072 | 10/1987 | Japan .................................. | 118/718 |

Primary Examiner—Richard Bueker
Attorney, Agent, or Firm—Wenderoth, Lind & Ponack

[57] ABSTRACT

An evaporation apparatus includes a vacuum chamber, a vacuum pump for producing a pressure-reduced atmosphere in the vacuum chamber, at least one vacuum evaporation source for evaporating an evaporation material provided in the vacuum chamber, a can, opposed to the vacuum evaporation source and rotating and ungrounded, for cooling a film on which the evaporation material is to be deposited, a supply roller for supplying the film to the can, a winding roller for winding the film on which the evaporation material has been deposited, a voltage-applying roller for assisting the winding and travel of the film and bringing into contact with a deposited material on the film, and a voltage applying device for applying a DC voltage to the film, on which the evaporation material has been deposited, through the voltage-applying roller to generate potential difference between the film and the can.

3 Claims, 6 Drawing Sheets

EVAPORATION APPARATUS

BACKGROUND OF THE INVENTION

The present invention relates to an evaporation apparatus for forming a metal membrane on a film.

FIG. 7 shows an example of a conventional evaporation apparatus. The apparatus comprises a film 1 on which a membrane is formed by evaporation; a material 2 to be vapor-deposited on the film 1; a vacuum evaporation source 3 consisting of resistance heating, high frequency induction heating, or electron beams for melting and evaporating the material 2; a grounded can 4 rotating in opposition to the vacuum evaporation source 3 and containing cooling liquid which is circulating therein to cool the surface of the film 1 on which the material 2 is being vapor-deposited; a supply roller 5 for supplying the film 1 to the can 4; an ungrounded winding roller 6 for winding the film 1, on which the material 2 has been vapor-deposited, the surface of which contacts the film 1 and is covered with an insulating tape or an insulating coating material such as polytetrafluoroethylene; an ungrounded free roller 7a, for assisting the winding or travel of the film 1, the surface of which contacts the film 1 and is covered with an insulating tape or an insulating coating material such as polytetrafluoroethylene; an ungrounded free roller 7b for assisting the winding or travel of the film 1 and conductive with the surface of the film 1 on which the material 2 has been vapor-deposited; a vacuum chamber 8; a vacuum pump for evacuating the interior of the vacuum chamber 8; a DC power source 10 for applying, through the free roller 7b, a DC voltage to the film 1 on which the material 2 has been vapor-deposited.

The operation of the apparatus with the above construction is described below with reference to FIG. 7.

The interior of the vacuum chamber 8 is evacuated to a vacuum degree of approximately $5 \times 10^{-5}$ Torr by the vacuum pump 9 such as a rotary pump, oil diffusion pump, or a cryopump. Then, the supply roller 5, the can 4, and the winding roller 6 are rotated. The film 1 travels in the order of the supply roller 5, the free roller 7a, the can 4, the free rollers 7b and 7a and is wound around the winding roller 6. Thereafter, the material 2 is melted and evaporated by vacuum evaporation source 3 consisting of resistance heating, high frequency induction heating or electron beams. Evaporated particles splash and are deposited on the surface of the film 1 being fed along the surface of the can 4 opposed to the film 1. Thus, a membrane is formed on the surface of the film 1. At this time, the DC power source 10 applies a positive voltage or a negative voltage to the material-deposited film 1 through the free roller 7b so as to generate potential difference between the film 1 and the can 4. As a result, the film 1 which has been brought into contact with the can 4 is cooled by the can 4 containing cooling liquid which is circulating therein. The film 1 then travels to the free rollers 7b and 7a and is wound around the winding roller 6.

According to the above construction, the evaporated material-deposited film is cooled in close contact with the can in early stage of evaporating process due to the difference between the voltage of the can and that of the film. Therefore, the film can be prevented from being thermally extended, contracted or melted by the condensation heat of particles which have been vapor-deposited on the film and the radiant heat emitted by the evaporation source. But when the evaporating operation is performed for a long time, the film is thermally deformed because of the temperature rise of the can. In order to prevent the thermal transformation of the film, it is necessary to bring the film into close contact with the can.

SUMMARY OF THE INVENTION

It is therefore an object of the present invention to provide an evaporation apparatus for allowing a film to be brought into close contact with a can so as to prevent the film from being thermally deformed by a material which has been vapor-deposited on the film.

In accomplishing these and other object, according to one aspect of the present invention, there is provided an evaporation apparatus comprising:

a vacuum chamber;

a vacuum pump for producing a pressure-reduced atmosphere in the vacuum chamber;

at least one vacuum evaporation source for evaporating an evaporation material provided in the vacuum chamber;

a can, opposed to the vacuum evaporation source and rotating and ungrounded, for cooling a film on which the evaporation material is to be deposited;

a supply roller for supplying the film to the can;

a winding roller for winding the film on which the evaporation material has been deposited;

a voltage-applying roller for assisting the winding and travel of the film and bringing into contact with a deposited material on the film; and voltage applying means for applying a DC voltage to the film, on which the evaporation material has been deposited, through the voltage-applying roller to generate potential difference between the film and the can. In the above construction, the can is ungrounded.

According to the above-described construction, a DC power source applies a positive or a negative voltage to the film on which a membrane has been formed. Thus, a reverse potential which has been generated on the surface of the ungrounded can does not leak therefrom. As a result, the potential difference between the film and the can is great. Accordingly, the film is capable of closely contacting the can and as such, the film can be cooled efficiently. When evaporation operation is performed for a long time or if the film becomes thin, the film can be prevented from being thermally extended, contracted or melted by the heat of condensation of the material which has been vapor-deposited on the film and radiant heat emitted by the evaporation source. Thus, the film can be wound round the winding roller without wrinkling the film.

BRIEF DESCRIPTION OF THE DRAWINGS

These and other objects and features of the present invention will become apparent from the following description taken in conjunction with the preferred embodiments thereof with reference to the accompanying drawings, in which.

DETAILED DESCRIPTION OF THE INVENTION

Figure 1:
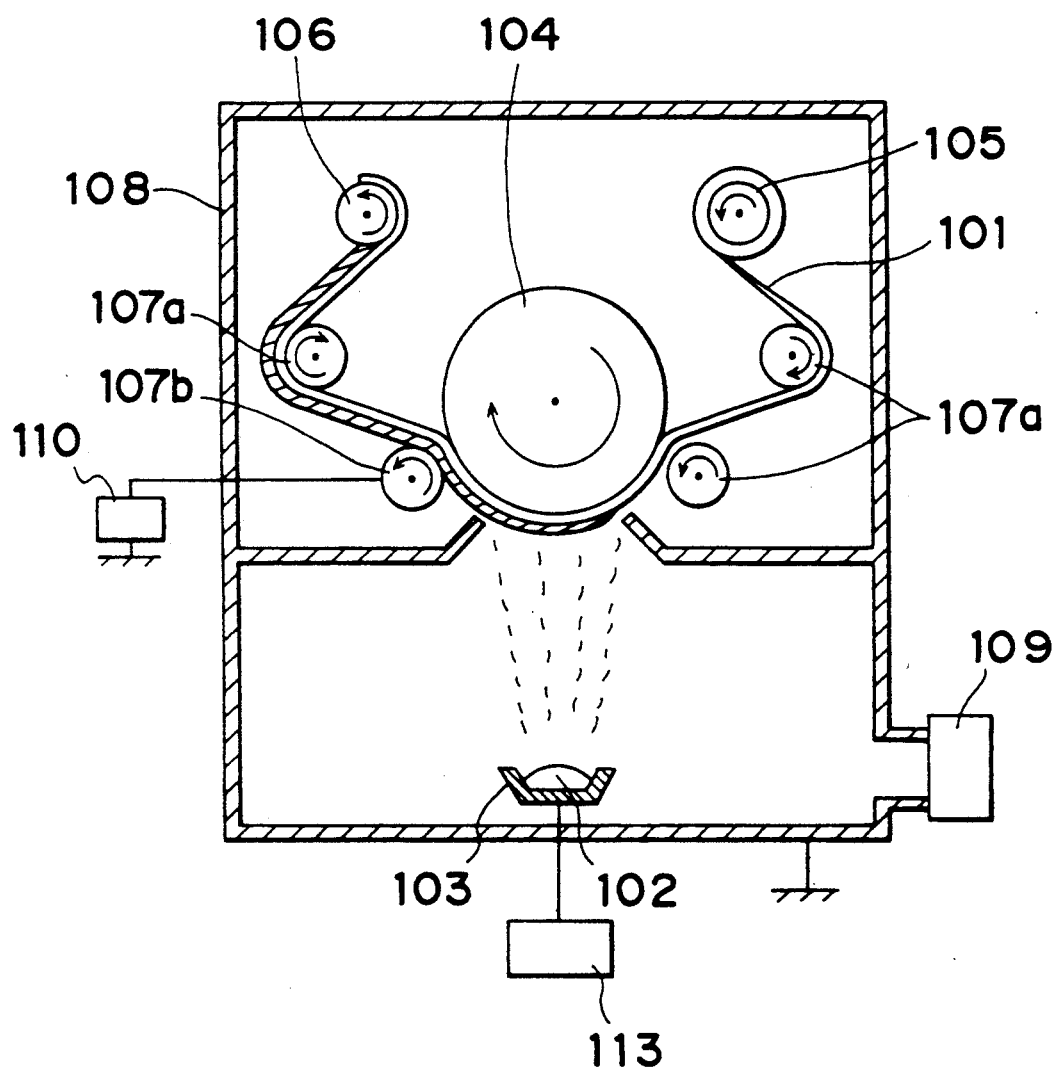
FIG. 1 is a schematic sectional view showing an evaporation apparatus for forming a membrane on a film according to an embodiment of the present invention.

Before the description of the present invention proceeds, it is to be noted that like parts are designated by like reference numerals throughout the accompanying drawings.

Figure 2:
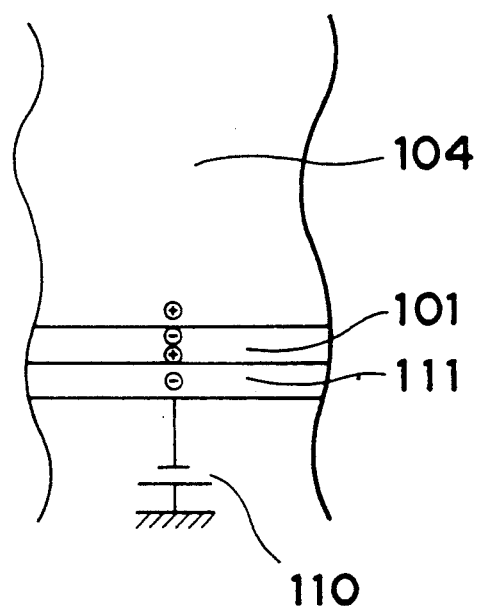
FIG. 2 is a sectional view showing a film and a can during an evaporating operation performed by the evaporation apparatus according to an embodiment of the present invention.
Figure 3:
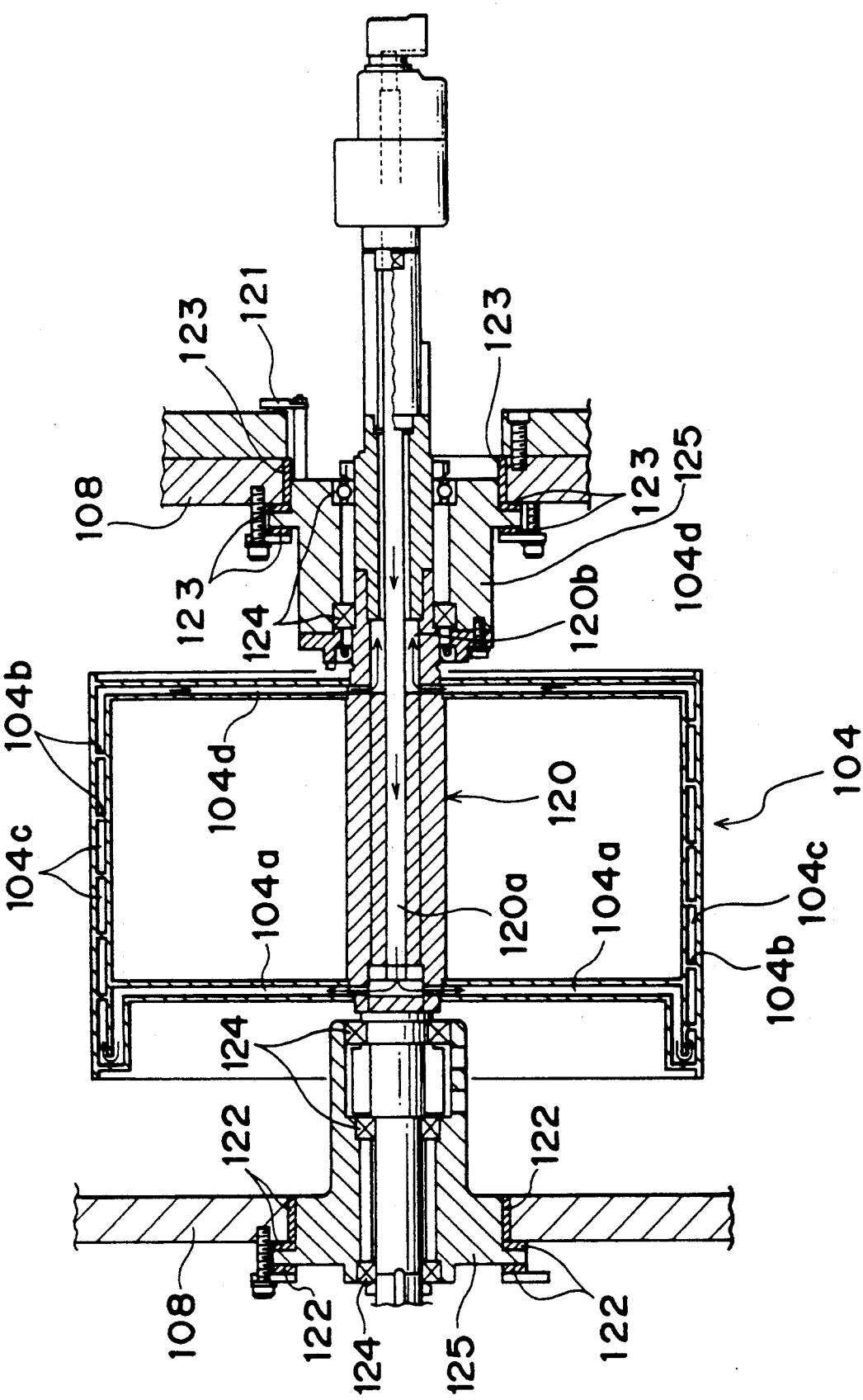
FIG. 3 is a sectional view of the can and the supporting mechanism thereof.

An evaporation apparatus according to an embodiment of the present is described below with reference to FIGS. 1, 2, 3, and 4. FIG. 1 is a schematic sectional view showing an evaporation apparatus for forming a membrane on a film according to the embodiment of the present invention. FIG. 2 is a sectional view showing a film and a can during an evaporating operation performed by the evaporation apparatus. FIG. 3 is a sectional view of the can and the supporting mechanism thereof. The apparatus includes a film 101 made of FEP, PET or the like on which a membrane is formed by evaporation; a material 102, such as aluminum, nickel or cobalt, to be vapor-deposited on the film 101; a container 103 accommodating the material 102; a vacuum evaporation source 113 consisting of resistance heating, high frequency induction heating, or electron beams for melting and evaporating the material 102; an ungrounded can 104, made of nickel plating etc., rotating in opposition to the container 103 and containing cooling liquid such as antifreeze which is circulating therein to cool the surface of the film 101 on which the material 102 is being vapor-deposited; a supply roller 105 for supplying the film 101 to the can 104; an ungrounded winding roller 106 for winding the film 101, on which the material 102 has been vapor-deposited, the surface of which contacts the film 101 and is covered with an insulating tape or an insulating coating material such as polytetrafluoroethylene resin; ungrounded free rollers 107a, for assisting the winding or travel of the film 101, the surface of which contacts the film 101 and is covered with an insulating tape or an insulating coating material such as polytetrafluoroethylene resin; an ungrounded free roller 107b for assisting the winding or travel of the film 101 and conductive with the surface of the film 101 on which the material 102 has been vapor-deposited; a vacuum chamber 108; a vacuum pump 109 for evacuating the interior of the vacuum chamber 108; and a DC power source 110 for applying, through the free roller 107b, a DC voltage to the film 101 on which the material 102 has been vapor-deposited. Referring to FIG. 2, a metal membrane 111 has been vapor-deposited on the film 101.

As shown in FIG. 3, the can 104 is fixed to a rotary shaft 120 rotatably supported by the walls of the chamber 108 through bearings 124. The bearings 124 are supported by supporting members 125 fixed to the walls through insulating members 122 and 123. The insulating members 122 and 123 are made of such as rubber. The rotary shaft 120 has a first passage 120a for supplying the cooling liquid to the can 104 and a second passage 120b for discharging the liquid from the can 104. The can 104 has a spiral passage 104c defined by small partitions 104b, a inlet passage 104a, and an outlet passage 104d through which the first passage 120a is connected to the second passage 120b. The surface of the can 104 is cooled by passing the liquid though the spiral passage 104c. Reference numeral 121 denotes a terminal for applying the voltage to the can 104 through the rotary shaft 120.

The operation of the apparatus with the above construction is described below with reference to FIGS. 1 and 2.

The interior of the vacuum chamber 108 is evacuated to a vacuum degree of approximately $5 \times 10^{-5}$ Torr by the vacuum pump 109 such as a rotary pump, oil diffusion pump, or a cryopump. Then, the supply roller 105, the can 104, and the winding roller 106 are rotated. The film 101 travels in the order of the supply roller 105, the free roller 107a, the can 104, the free rollers 107b and 107a and is wound around the winding roller 106. Thereafter, the material 102 is melted and evaporated by the vacuum evaporation source 113. Evaporated particles scatter and are deposited on the surface of the film 101 being fed along the surface of the can 104 opposed to the film 101. Thus, a membrane 111 is formed on the surface of the film 101. At this time, the DC power source 110 applies a voltage of more than 0 V and not more than $-500$ V to the material-deposited film 101 through the free roller 107b so as to generate potential difference between the film 101 and the can 104. The voltage is preferably $-100$ to $-500$ V. As a result, the film 101 which has been brought into contact with the can 104 is cooled by the can 104 containing the cooling liquid which is circulating therein. The film 101 then travels to the free rollers 107b and 107a and is wound around the winding roller 106.

Figure 4:
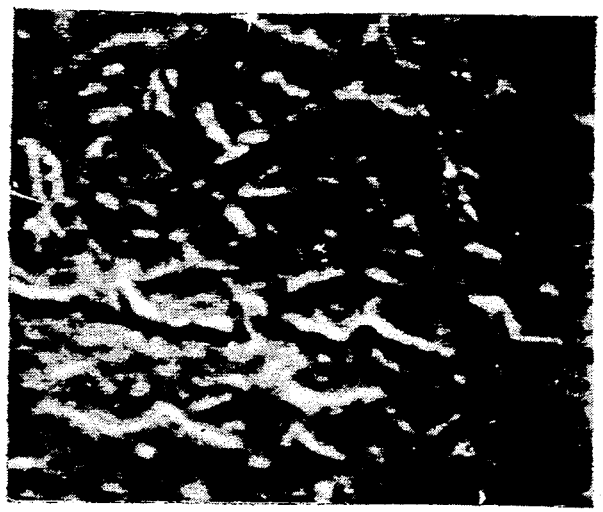
FIGS. 4 and 5 are enlarged photographs of the result of the experiments for comparison between the apparatus of the embodiment and the conventional apparatus.
Figure 5:
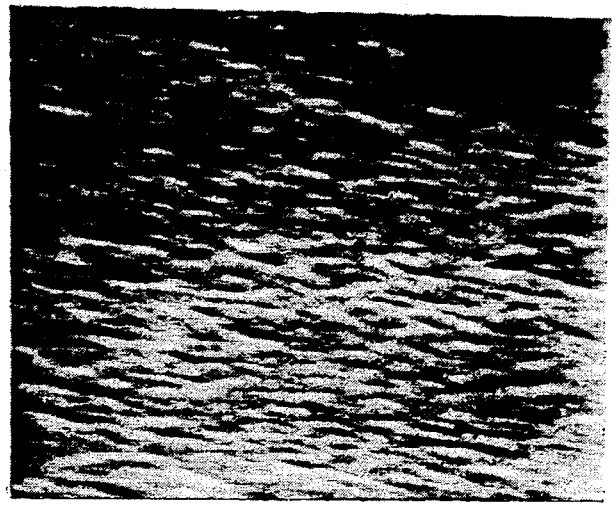

FIGS. 4 and 5 show enlarged drawings showing the photographs of the result of the experiments for comparison between the apparatus of the embodiment and the conventional apparatus. Each enlargement ration is ten thousand. That is, in the apparatus of the embodiment, nickel membrane with 1,500 ° Å in thickness is deposited on a film of FEP with 12.5 micrometers in thickness and 350 mm in width in the vacuum degree of $5 \times 10^{-5}$ Torr while a voltage of $-200$ V is applied by the DC power source 110, the can 104 is ungrounded, and the can 104 rotates at a speed of 5 meter/minute. In the conventional apparatus, the experiment is performed under the same condition as that of the embodiment except that the can is grounded. There are deep wrinkle and a transversely elongated crack on the surface of the membrane formed by the conventional apparatus as shown in FIG. 4. There are shallow wrinkle and no crack on the surface of the membrane formed by the apparatus of the embodiment as shown in FIG. 5.

Figure 6:
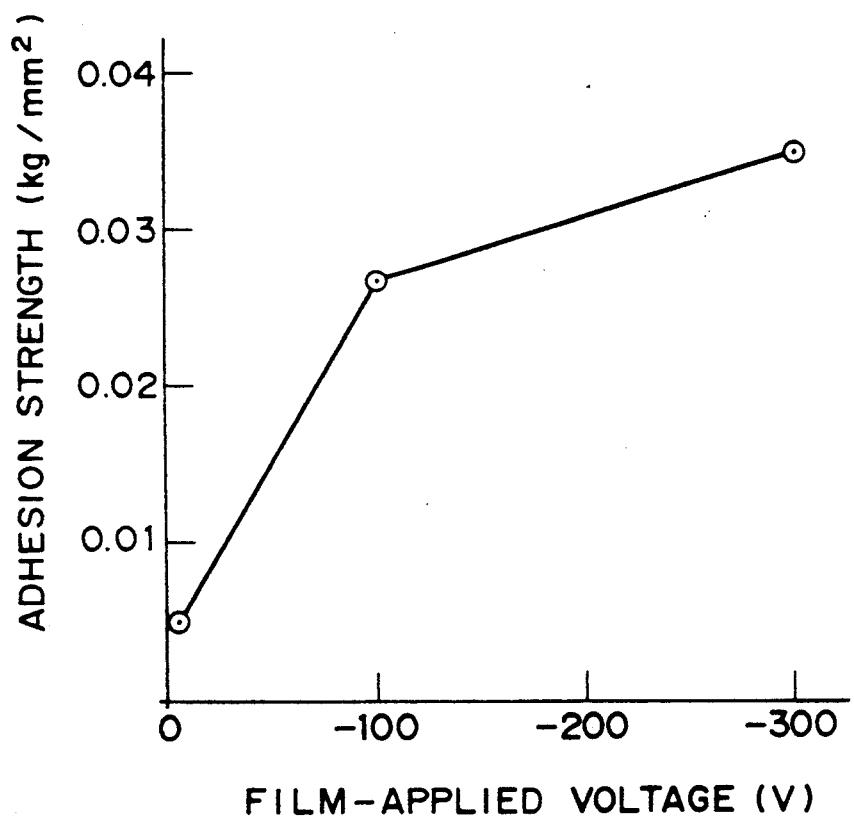
FIG. 6 is a graph showing the relation between the film-applied voltage and the adhesive strength between the membrane and the film under the same condition as that of the experiment of FIG. 5.
Figure 7:
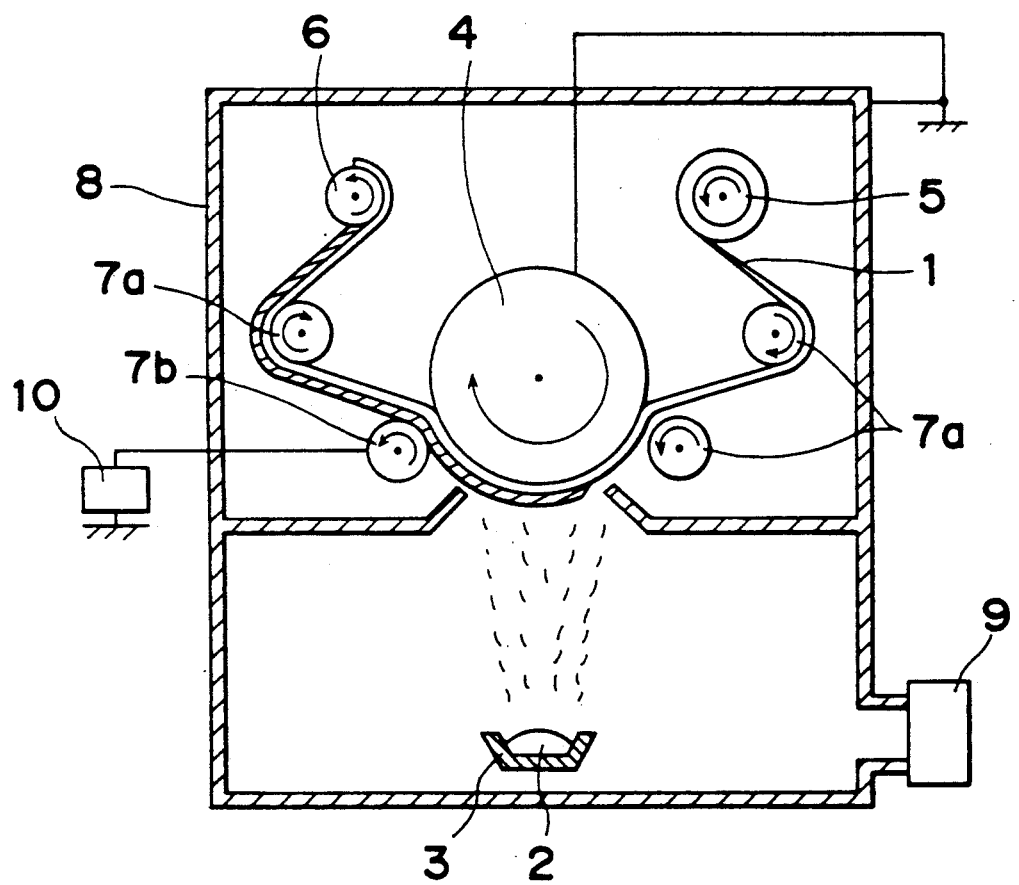
FIG. 7 is a schematic sectional view showing a conventional evaporation apparatus.

FIG. 6 shows the relation between the film-applied voltage and the adhesive strength between the membrane and the film under the same condition as that of the experiment of FIG. 5.

As described above, according to the embodiment, a negative voltage is applied through the free roller 107b to the membrane 111 which has been formed on the film 101. Thus, a positive potential which has been generated on the surface of the ungrounded can 104 can be charged up. As a result, the potential difference between the film 101 and the can 104 is great. Accordingly, the film 101 is capable of closely contacting the can 104 and as such, the film 101 can be cooled efficiently. When evaporation operation is performed for a long time or if the film 101 becomes thin, the film can be prevented from being thermally extended, contracted or melted by the heat of condensation of particles which have been vapor-deposited on the film 101 and the radiant heat emitted by the evaporation source 113. Thus, the film 101 can be wound round the winding roller 106 without wrinkling the film 101.

According to the embodiment, a film made of polytetrafluoroethylene resin such as FEP which is as low as 20° C. in its melting point can be prevented from being thermally deformed.

Instead of applying a negative voltage to the membrane 111 which has been formed on the film 101, it is possible for the DC power source 110 to apply a positive voltage to the can 104 so that the negative voltage can charge on the membrane 111. Alternatively, it is possible to apply different positive voltages to the can 104 and the membrane 111 which causes the potential difference.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An evaporation apparatus comprising:
   a vacuum chamber;
   a vacuum pump for producing a pressure-reduced atmosphere in the vacuum chamber;
   at least one vacuum evaporation source for evaporating an evaporation material provided in the vacuum chamber;
   a can, opposed to the vacuum evaporation source and rotating and ungrounded, for cooling a film on which the evaporation material is to be deposited;
   a supply roller for supplying the film to the can;
   a winding roller for winding the film on which the evaporation material has been deposited;
   a voltage-applying roller for assisting the winding and travel of the film and bringing into contact with a deposited material on the film; and
   voltage applying means for applying a DC voltage to the film, on which the evaporation material has been deposited, through the voltage-applying roller to generate potential difference between the film and the can.

2. The evaporation apparatus as claimed in claim 1, wherein the can is rotatably supported by a wall of the vacuum chamber and is insulated from the wall.

3. The evaporation apparatus as claimed in claim 1, wherein by applying the voltage by the voltage applying means, the can has a positive voltage and the membrane has a negative voltage.

* * * * *